United States Patent
Zhu et al.

(10) Patent No.: US 8,431,426 B1
(45) Date of Patent: Apr. 30, 2013

(54) COATING METHOD FOR LIQUID CRYSTAL ALIGNMENT FILM OF TFT-LCD

(75) Inventors: Mei-Na Zhu, Guangdong (CN);
Jian-Jun Zhao, Guangdong (CN);
Hsiang-Yin Shih, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/379,808

(22) PCT Filed: Dec. 8, 2011

(86) PCT No.: PCT/CN2011/083715
§ 371 (c)(1),
(2), (4) Date: Dec. 21, 2011

(30) Foreign Application Priority Data

Nov. 15, 2011 (CN) .......................... 2011 1 0363663

(51) Int. Cl.
*H01L 21/00* (2006.01)
(52) U.S. Cl.
USPC .......................................................... 438/30
(58) Field of Classification Search ............... 438/30, 438/780, 781, 99; 257/E23.06; 349/187, 349/189
See application file for complete search history.

(56) References Cited

U.S. PATENT DOCUMENTS

| | | | |
|---|---|---|---|
| 2005/0126410 A1* | 6/2005 | Won et al. ...................... | 101/359 |
| 2006/0172091 A1* | 8/2006 | Tung et al. ..................... | 428/1.32 |
| 2007/0212621 A1* | 9/2007 | Lee et al. .......................... | 430/7 |
| 2010/0002177 A1* | 1/2010 | Chien et al. .................... | 349/124 |

FOREIGN PATENT DOCUMENTS

| | | |
|---|---|---|
| CN | 1658050 A | 8/2005 |
| CN | 101162332 A | 4/2008 |
| CN | 101592826 A | 12/2009 |
| JP | 2002122723 A | 4/2002 |
| KR | 20060020321 A | 3/2006 |
| TW | 200411305 | 7/2004 |

OTHER PUBLICATIONS

K. Suzuki, K. Yutani, M. Nakashima, A. Onodera, S. Mizukami, M. Kato, T. Tano, H. Tomono, M. Yanagisawa, and K. Kameyama "A 200 ppi All-printed Organic TFT Backplane for Flexible Electrophoretic Displays" Ricoh Co., Ltd., 16-1 Shinei-cho, Tsuzuki-ku Yokohama, 224-0035, Japan.*
T. Shimoda, K. Morii, S. Seki, and H. Kiguchi, "Inkjet printing of light-emitting polymer displays" MRS Bulletin Nov. 2003, 821-827.*
C. R. Kagan, T. L. Breen, L. L. Kosbar, "Patterning organic-inorganic thin film transistors using microcontact printed templates" Appl. Phys. Lett. 79, 3536 (2001).*

* cited by examiner

*Primary Examiner* — Charles Garber
*Assistant Examiner* — Brigitte Paterson
(74) *Attorney, Agent, or Firm* — Muncy, Geissler, Olds & Lowe, PLLC

(57) ABSTRACT

A coating method for liquid crystal alignment film of TFT-LCD including: forming a layer of hydrophobic film on a TFT/CF substrate corresponding to a non-display area, the hydrophobic film separates the TFT/CF substrate into a plurality of rectangular opened areas which are separated from each other, each of the rectangular opened areas corresponds to a display area and its outer frame is formed by the hydrophobic film; and coating of a liquid of a material of an alignment film along a boundary of the rectangular opened area. Accordingly, edge waves caused by spreading of drips of the material of the alignment film can be reduced, so that a precision of printing of the alignment film can be controlled effectively.

6 Claims, 5 Drawing Sheets

US 8,431,426 B1

COATING METHOD FOR LIQUID CRYSTAL ALIGNMENT FILM OF TFT-LCD

FIELD OF THE INVENTION

The present invention relates to a manufacturing technique of liquid crystal display device and more particularly to a coating technique for liquid crystal alignment film of LCD.

BACKGROUND OF THE INVENTION

PI (polyimide) film is a layer of even alignment film on a surface of TFT (Thin Film Transistor) substrate and CF (Color Filter) substrate, it makes liquid crystal molecules to be arranged according to a certain pre-tilt angle in order to control a passing direction of light, and achieve a display purpose by applying an appropriate driving voltage. Currently, there are mainly two coating methods of coating technique for PI film: PI roller coating and PI inkjet.

Referring to FIG. 1, a process for transfer-printing technique mainly includes: a polyimide (PI) solution is ejected from a PI nozzle 4 and it drips on a turning metal roller 3, a scraper 5 is used to scrape excessive PI solution, the metal roller 3 turns and is in contact with a plate cylinder 6, and the PI solution is stored on a printing plate 7 which is attached on the plate cylinder 6, then the plate cylinder 6 turns and is in contact with a glass base plate 1 on a printing stage 2, finally the PI solution is transfer-printed on the glass base plate 1. The roller coating technique has the following drawbacks: cumbersome equipment, poor mobility, large consumption of consumables (dummy base plates and printing plates), thickness film which is difficult to adjust, complicated operation, low PI usage percentage, high operating costs and common deficiencies easily caused by polluted printing plates.

Referring to FIGS. 2, 3, 4a and 4b, PI inkjet is controlled by using deformation of piezoelectric ceramics, so that a PI drip 8 is dripped from a nozzle hole 9 and land on a glass base plate 1 disposed on a printing stage 2, the PI drip 8 is then evenly spread on the glass base plate 1, and an even film is formed by diffusion of the PI drip 8. This technical method has the following drawbacks: large uneven area of edges of the film thickness, small nozzle hole which is easy to be clogged, interval difference of the nozzle hole 9 and uneven spreading which will produce deficient products with uneven inner lines and inner surfaces. The most serious deficiency is that, the PI drip 8 is unable to be spread evenly to form a film when a segmental difference of the base plate surface is too large, as a result, product quality is substantially decreased and even large quantity of products is rejected. Furthermore, for the printing method of PI inkjet, because of the spreading of the drips, thus a halo area shown in FIG. 4a and an edge wave shown in FIG. 4b can be easily formed, which will affect the quality of PI film.

US patent number 20060172091 discloses a forming method of alignment film, by forming a layer of hydrophobic film on parts of a surface of a TFT substrate corresponding to a non-display area, and forming a layer of hydrophilic film on parts corresponding to a display area, so that a boundary of the hydrophilic film is limited by the hydrophobic film, and by employing the inkjet printing method, an alignment film is then formed by dripping of a liquid of the material of the alignment film. Such forming method of employing inkjet printing on the areas corresponding to the hydrophobic film is the same as the conventional technique illustrated in FIG. 3. Even though the deficiency of substantially decreased product quality and large quantity of rejected products caused by the drips being unable to be spread evenly to form a film when a segmental difference of the base plate surface is too large, can be avoided to a certain degree; the problems of halo area shown in FIG. 4a and edge wave shown in FIG. 4b still exist, which will affect the quality of the alignment film. Therefore, the inkjet method of alignment film of conventional coating technique needs to be improved.

SUMMARY

In order to tackle the abovementioned conventional technical problems, the present invention provides a coating method for liquid crystal alignment film of TFT-LCD, by which edge waves of an alignment film caused by inkjet printing can be reduced, and a precision of printing of the alignment film can be controlled effectively.

A technical solution employed by the present invention to tackle the above-mentioned technical problems includes providing a coating method for liquid crystal alignment film of TFT-LCD, including:

forming a layer of hydrophobic film on a TFT/CF substrate corresponding to a non-display area, the hydrophobic film separates the TFT/CF substrate into a plurality of rectangular opened areas which are separated from each other, each of the rectangular opened areas corresponds to a display area and its outer frame is formed by the hydrophobic film; and coating of a liquid of a material of an alignment film along a boundary of the rectangular opened area.

The coating method of the present invention further including:

Forming a layer of hydrophilic film on the rectangular opened area, the coating of the liquid of the material of the alignment film is performed along a boundary of the hydrophilic film and the hydrophobic film.

Having a same thickness of the hydrophilic film and the hydrophobic film.

Realizing the coating of the liquid of the material of the alignment film by spraying of continuous lines.

Connecting the continuous lines as a rectangle corresponding to the boundary of the rectangular opened area.

The hydrophobic film is formed by coating a layer of hydrophobic polymer on the TFT/CF substrate corresponding to the non-display area.

The hydrophilic film is formed by coating a layer of hydrophilic polymer on the rectangular opened area of the TFT/CF substrate.

The material of the alignment film is polyimide.

Comparing with the conventional techniques and according to the coating method for liquid crystal alignment film of TFT-LCD of the present invention, by forming a layer of hydrophobic film on the surface of the TFT/CF substrate, and performing the coating on the boundary of the rectangular opened area and the hydrophobic film, the edge waves caused by spreading of the drips of the material of the alignment film can be reduced, so that a precision of printing of the alignment film can be controlled effectively.

DETAILED DESCRIPTION OF THE INVENTION

The present invention will become more fully understood by reference to the following detailed description thereof when read in conjunction with the attached drawings.

Figure 5:
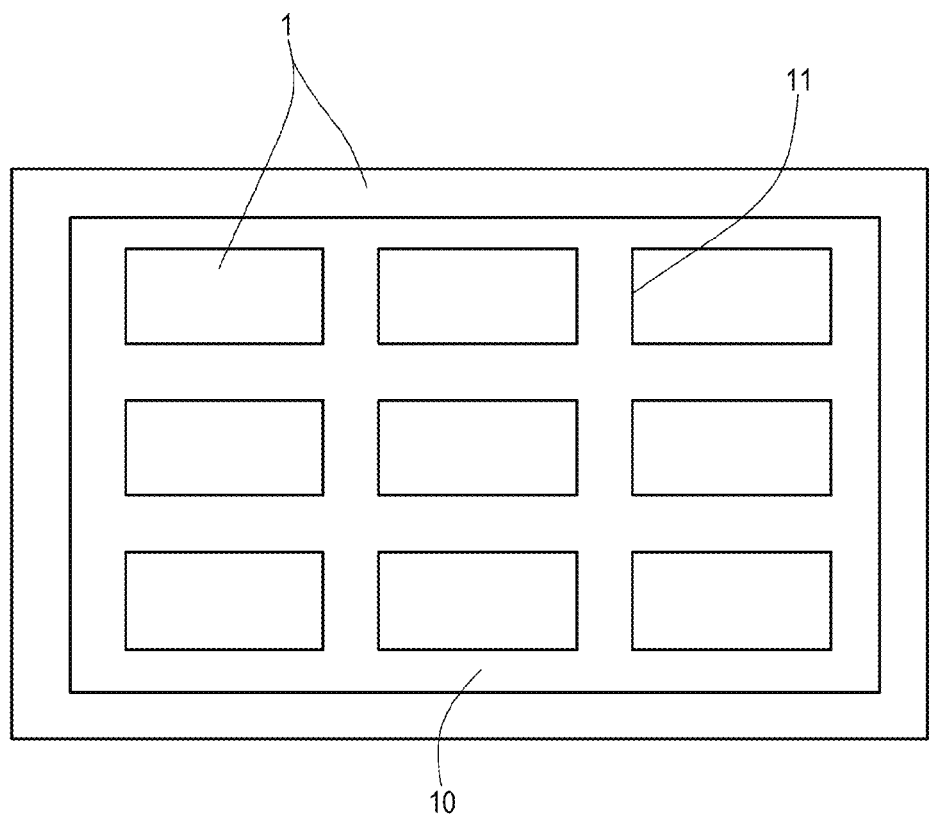
FIG. 5 is a structural illustration of a hydrophobic film and a TFT/CF substrate in a coating technique for liquid crystal alignment film of TFT-LCD according to the present invention.

Referring to FIG. 5, the present invention provides a coating method for liquid crystal alignment film of TFT-LCD, forming a layer of hydrophobic film 10 on a TFT/CF substrate 1 corresponding to a non-display area, the hydrophobic film 10 separates the TFT/CF substrate 1 into a plurality of rectangular opened areas which are separated from each other, each of the rectangular opened areas corresponds to a display area and its outer frame is formed by the hydrophobic film 10; and coating of a liquid of a material of an alignment film along a boundary 11 of the rectangular opened area. Preferably, the material of the alignment film is PI (polyimide).

In the coating method of the present invention, it further includes: forming a layer of hydrophilic film on the rectangular opened area, the coating of the liquid of the material of the alignment film is performed along the boundary 11 of the hydrophilic film and the hydrophobic film 10. Preferably, having a same thickness of the hydrophilic film and the hydrophobic film 10. Wherein, the hydrophobic film 10 is formed by coating a layer of hydrophobic polymer on the TFT/CF substrate 1 corresponding to the non-display area. The hydrophilic film is formed by coating a layer of hydrophilic polymer on the rectangular opened area of the TFT/CF substrate 1.

Figure 1:
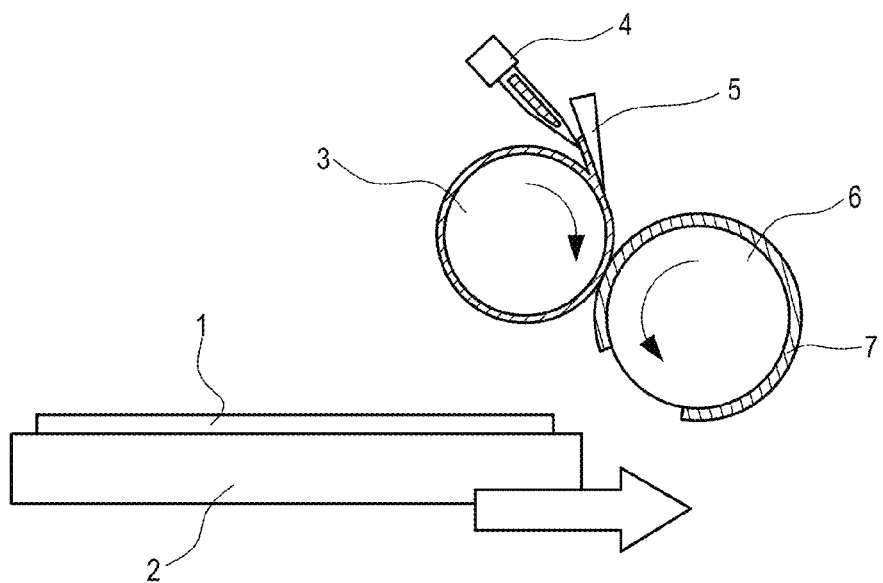
FIG. 1 is an illustration of a conventional roller coating technique for liquid crystal alignment film of TFT-LCD.
Figure 2:
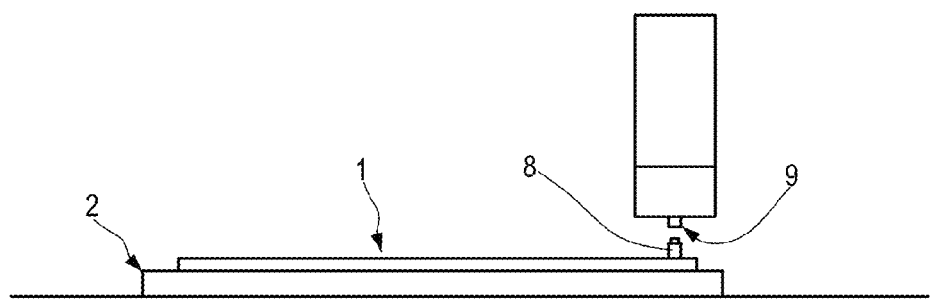
FIG. 2 is an illustration of a conventional inkjet coating technique for liquid crystal alignment film of TFT-LCD.
Figure 3:
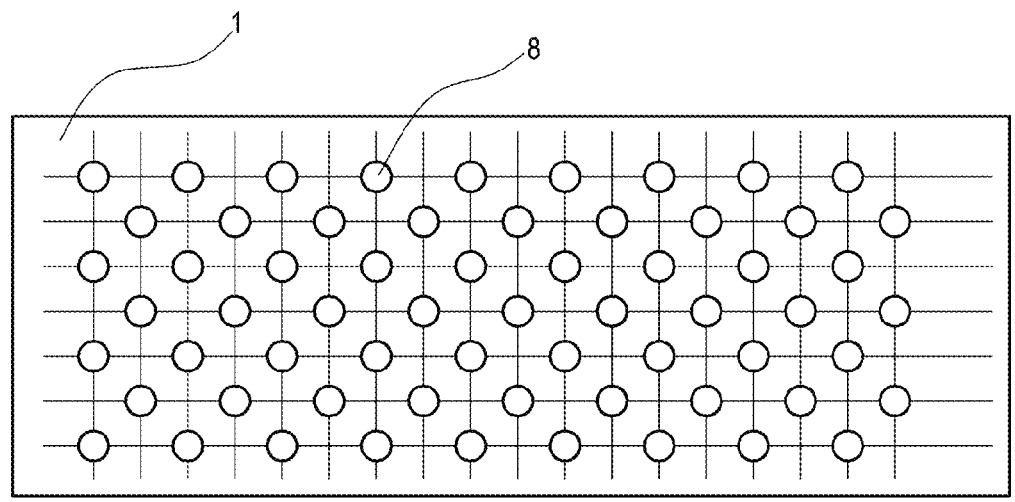
FIG. 3 is a structural illustration of an alignment film produced by using a conventional inkjet coating technique.
Figure 4A:
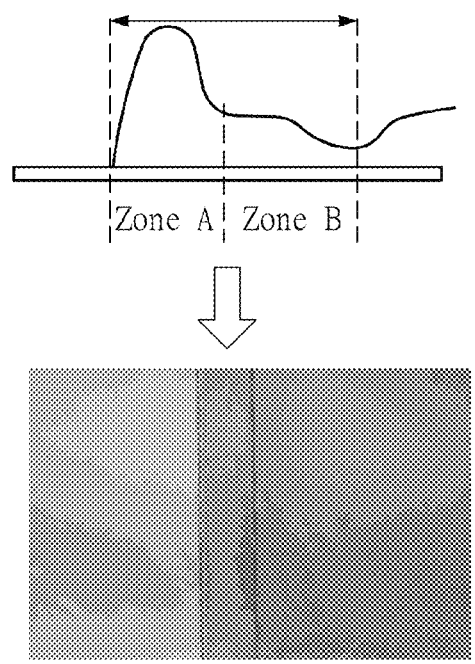
FIGS. 4a and 4b are illustrations of a halo area and an edge wave respectively which are easily caused by employing a conventional inkjet coating technique.
Figure 4B:
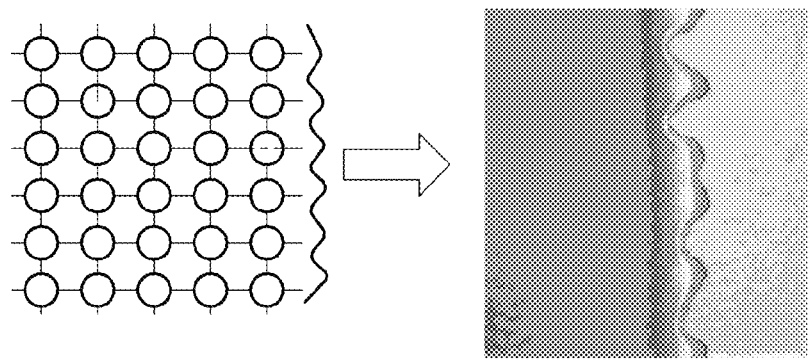

In the coating method of the present invention, the coating of the liquid of the material of the alignment film can be realized by spraying of continuous lines. The continuous lines are connected as a rectangle corresponding to the boundary 11 of the rectangular opened area, in other words, a shape of the coating of the liquid of the material of the alignment film is a rectangle, and is not an array composed of dots as shown in FIG. 3 in an conventional inkjet coating technique.

Figure 6A:
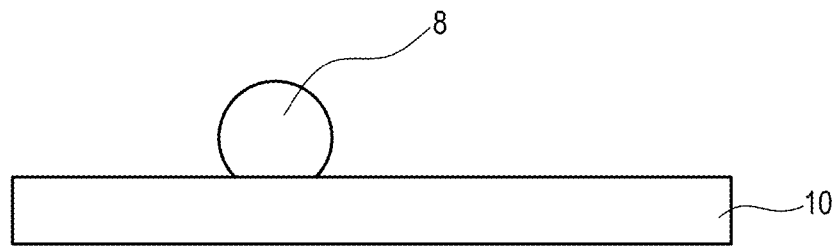
FIGS. 6a and 6b are illustrations of a PI drip spreading on a hydrophobic interface and a hydrophilic interface respectively.
Figure 6B:
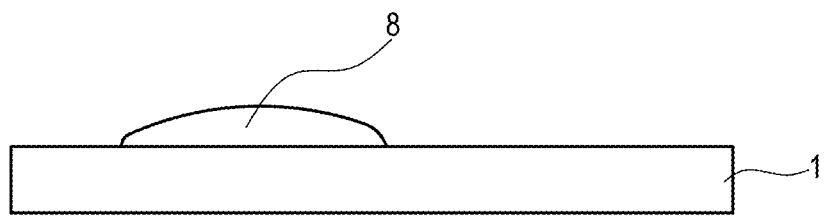

Referring to FIGS. 6a and 6b, the present invention takes full advantage of a PI drip showing a non-wetting condition on a hydrophobic interface, and showing a complete wetting condition and a partial wetting condition on a hydrophilic interface.

Figure 7A:
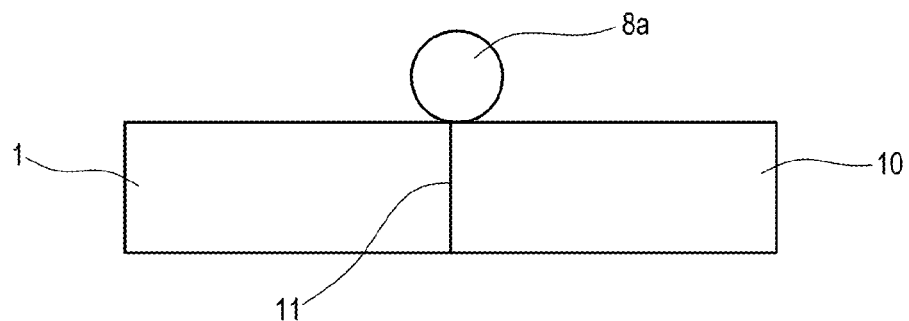
FIGS. 7a, 7b, 7c and 7d are illustrations of a process of a PI drip spreading on a hydrophobic film and a hydrophilic film in a coating technique for liquid crystal alignment film of TFT-LCD according to the present invention.
Figure 7B:
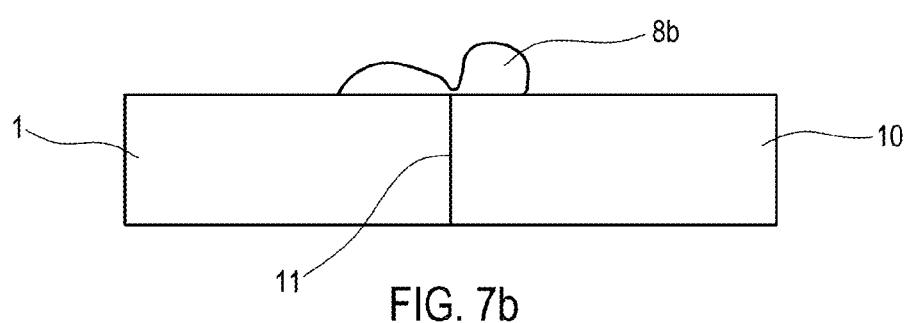
Figure 7C:
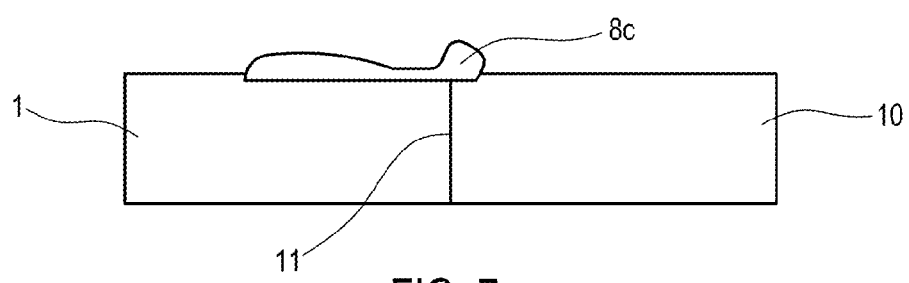
Figure 7D:
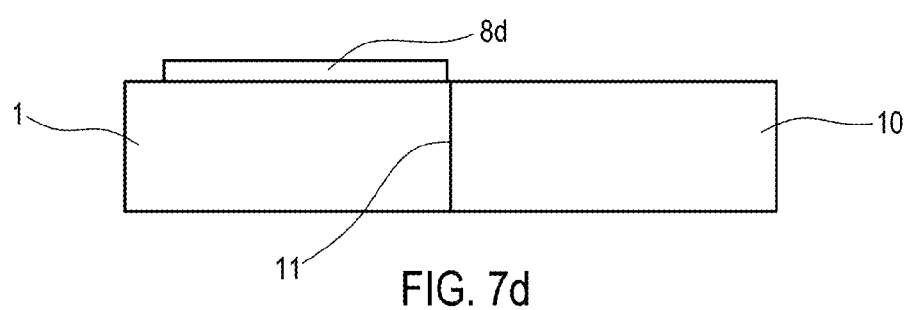

Referring to FIGS. 7a, 7b, 7c and 7d, they show a spreading process of a PI drip, wherein an inertial condition of a PI drip 8a being sprayed on the boundary 11 is shown in FIG. 7a, then the PI drip 8a is changed to the PI drip 8b as shown in FIG. 7b, then the PI drip 8b is changed to the PI drip 8c as shown in FIG. 7c, finally, the PI drip 8c is changed to the PI drip 8d as shown in FIG. 7d; up to this point, the PI drip is fully spread on the hydrophobic film 10, and after a subsequent process of drying and other procedures, a finished product of PI film is formed.

Comparing with the conventional techniques and according to the coating method for liquid crystal alignment film of TFT-LCD of the present invention, by forming a layer of hydrophobic film on the surface of the TFT/CF substrate, and performing the coating on the boundary of the rectangular opened area and the hydrophobic film, a PI film with excellent straightness of edges can be manufactured.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A coating method for a liquid crystal alignment film of a TFT-LCD, including:
   forming a layer of hydrophobic film on a TFT/CF substrate corresponding to a non-display area, the layers of hydrophobic film separating the TFT/CF substrate into a plurality of rectangular opened areas being separated from each other, wherein each of the plurality of rectangular opened areas corresponds to a display area that has an outer frame that is formed by the layer of hydrophobic film; and
   coating of a liquid of a material of an alignment film along a boundary of each area of the plurality of rectangular opened areas, wherein the coating of the liquid of the material of the alignment film is performed by spraying of continuous lines, and the continuous lines are connected as a rectangle corresponding to the boundary of each area of the plurality of rectangular opened areas.

2. The coating method as claimed in claim 1, further comprising:
   forming a layer of hydrophilic film on the rectangular opened area, the coating of the liquid of the material of the alignment film being performed along a boundary of the hydrophilic film and the hydrophobic film.

3. The coating method as claimed in claim 2, wherein having a same thickness of the hydrophilic film and the hydrophobic film.

4. The coating method as claimed in claim 1, wherein the hydrophobic film is formed by coating a layer of hydrophobic polymer on the TFT/CF substrate corresponding to the non-display area.

5. The coating method as claimed in claim 2, wherein the hydrophilic film is formed by coating a layer of hydrophilic polymer on the plurality of rectangular opened areas of the TFT/CF substrate.

6. The coating method as claimed in claim 1, wherein the material of the alignment film is polyimide.

* * * * *